United States Patent
Mehrjoo et al.

(10) Patent No.: US 10,566,937 B2
(45) Date of Patent: Feb. 18, 2020

(54) POST DISTORTION CANCELLATION WITH PHASE SHIFTER DIODE FOR LOW NOISE AMPLIFIER

(71) Applicant: QUALCOMM Incorporated, San Diego, CA (US)

(72) Inventors: Mohammad Sadegh Mehrjoo, San Diego, CA (US); Chuan Wang, San Diego, CA (US); Yanming Xiao, San Diego, CA (US); Li-chung Chang, Irvine, CA (US); Kevin Hsi Huai Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/583,636

(22) Filed: May 1, 2017

(65) Prior Publication Data
US 2018/0175806 A1    Jun. 21, 2018

Related U.S. Application Data

(60) Provisional application No. 62/435,345, filed on Dec. 16, 2016.

(51) Int. Cl.
| | |
|---|---|
| H03F 3/04 | (2006.01) |
| H03F 1/32 | (2006.01) |
| H03F 3/193 | (2006.01) |
| H03F 1/22 | (2006.01) |
| H03F 3/24 | (2006.01) |
| H03F 3/21 | (2006.01) |

(52) U.S. Cl.
CPC ............ *H03F 1/3205* (2013.01); *H03F 1/223* (2013.01); *H03F 3/193* (2013.01); *H03F 3/211* (2013.01); *H03F 3/245* (2013.01); *H03F 2200/105* (2013.01); *H03F 2200/294* (2013.01); *H03F 2200/451* (2013.01); *H03F 2200/541* (2013.01)

(58) Field of Classification Search
CPC .............................. H03F 1/3205; H03F 3/193
USPC ................................ 330/149, 311, 302, 296
See application file for complete search history.

(56) References Cited

U.S. PATENT DOCUMENTS

| | | | |
|---|---|---|---|
| 6,556,085 B2 * | 4/2003 | Kwon | H03F 1/223 330/285 |
| 7,746,169 B2 | 6/2010 | Holenstein et al. | |
| 7,889,007 B2 | 2/2011 | Kim et al. | |
| 8,848,824 B2 | 9/2014 | Teetzel | |
| 9,178,473 B2 | 11/2015 | Sankaranarayanan | |
| 9,231,529 B2 | 1/2016 | Syed et al. | |

(Continued)

OTHER PUBLICATIONS

Kim N., et al., "A Cellular-Band CDMA 0.25-μM CMOS LNA Linearized Using Active Post-Distortion," IEEE Journal of Solid-State Circuits, vol. 41, No. 7, Jul. 1, 2006, pp. 1530-1534, ISSN: 0018-9200 (p. 1530 line 15-p. 1533 line 7).

(Continued)

*Primary Examiner* — Khanh V Nguyen
*Assistant Examiner* — Khiem D Nguyen
(74) *Attorney, Agent, or Firm* — Seyfarth Shaw LLP/Qualcomm Incorporated

(57) ABSTRACT

A low noise amplifier may include a post distortion cancellation block coupled to the low noise amplifier. The post distortion cancellation block may include a diode, and phase-shift logic. The phase-shift logic may be coupled in series with the diode.

21 Claims, 12 Drawing Sheets

(56) References Cited

U.S. PATENT DOCUMENTS

2007/0098417 A1* 5/2007 Peral .................... H03F 1/3241
  398/208

OTHER PUBLICATIONS

Zhang H., et al., "A Low-Power, Linearized, Ultra-Wideband LNA Design Technique," IEEE Journal of Solid-State Circuits, Feb. 2009, vol. 44, No. 2, pp. 320-330.

* cited by examiner

US 10,566,937 B2

POST DISTORTION CANCELLATION WITH PHASE SHIFTER DIODE FOR LOW NOISE AMPLIFIER

CROSS-REFERENCE TO RELATED APPLICATION

The present application claims the benefit of U.S. Provisional Patent Application No. 62/435,345, filed on Dec. 16, 2016, and titled "POST DISTORTION CANCELLATION WITH PHASE SHIFTER DIODE FOR LOW NOISE AMPLIFIER," the disclosure of which is expressly incorporated by reference herein in its entirety.

TECHNICAL FIELD

The present disclosure generally relates to low noise amplifiers (LNAs). More specifically, aspects of the present disclosure relate to post distortion cancellation for low noise amplifiers.

BACKGROUND

Amplifiers are commonly used in various electronic devices to provide signal amplification. Different types of amplifiers are available for different uses. For example, a wireless communication device (e.g., a cellular phone) may include a transmitter and a receiver for bi-directional communication. The receiver may use a low noise amplifier (LNA), while the transmitter may use a power amplifier (PA). In addition, the receiver and the transmitter may use variable gain amplifiers (VGAs).

Front-end circuit blocks may perform various functions such as filtering, switching between the transmitter and the receiver, impedance matching, and the like. These front-end circuit blocks may be implemented with discrete components external to an integrated circuit (IC) containing the low noise amplifier. Depending on the complexity of functions performed, these discrete, external components may substantially increase the cost and size of the receiver. Each of these circuit blocks may also exhibit insertion loss, which may degrade a noise figure (NF) of the receiver. Degrading the noise figure of the receiver degrades the performance of the receiver.

In an RF receiver, an input signal from the antenna first passes through the LNA that amplifies the input signal, while suppressing noise contributions. As a result, a low noise figure (NF) and high gain are important LNA performance parameters. In particular, LNA designs involve tradeoffs among linearity, input matching, power dissipation, and the like. These tradeoffs may dictate the type of LNA topology that is selected. For example, a common source (CS) LNA is a type of LNA that is popular due to its noise performance. Conversely, a common gate (CG) LNA is a type of LNA that provides a wideband input match that is less sensitive to input parasitic capacitance.

SUMMARY

A low noise amplifier may include a post distortion cancellation block coupled to the low noise amplifier. The post distortion cancellation block may include a diode, and phase-shift logic. The phase-shift logic may be coupled in series with the diode.

A method for performing post distortion cancellation in a low noise amplifier may include detecting a power level at an output of the low noise amplifier. The method may also include selecting a bias setting and a resistance-capacitance setting according to the power level detected at the output of the low noise amplifier. The method may further include programming a post distortion cancellation block of the low noise amplifier with the bias setting and the resistance-capacitance setting.

A low noise amplifier may include a post distortion cancellation block coupled to the low noise amplifier. The post distortion cancellation block may include a diode, and phase-shift logic. The phase-shift logic may be coupled in series with the diode. The low noise amplifier may further include a means for programming the post distortion cancellation block with a bias setting and a resistance-capacitance setting. The bias setting and the resistance-capacitance setting may be selected according to an output power level of the low noise amplifier.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR" and the use of the term "or" is intended to represent an "exclusive OR".

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
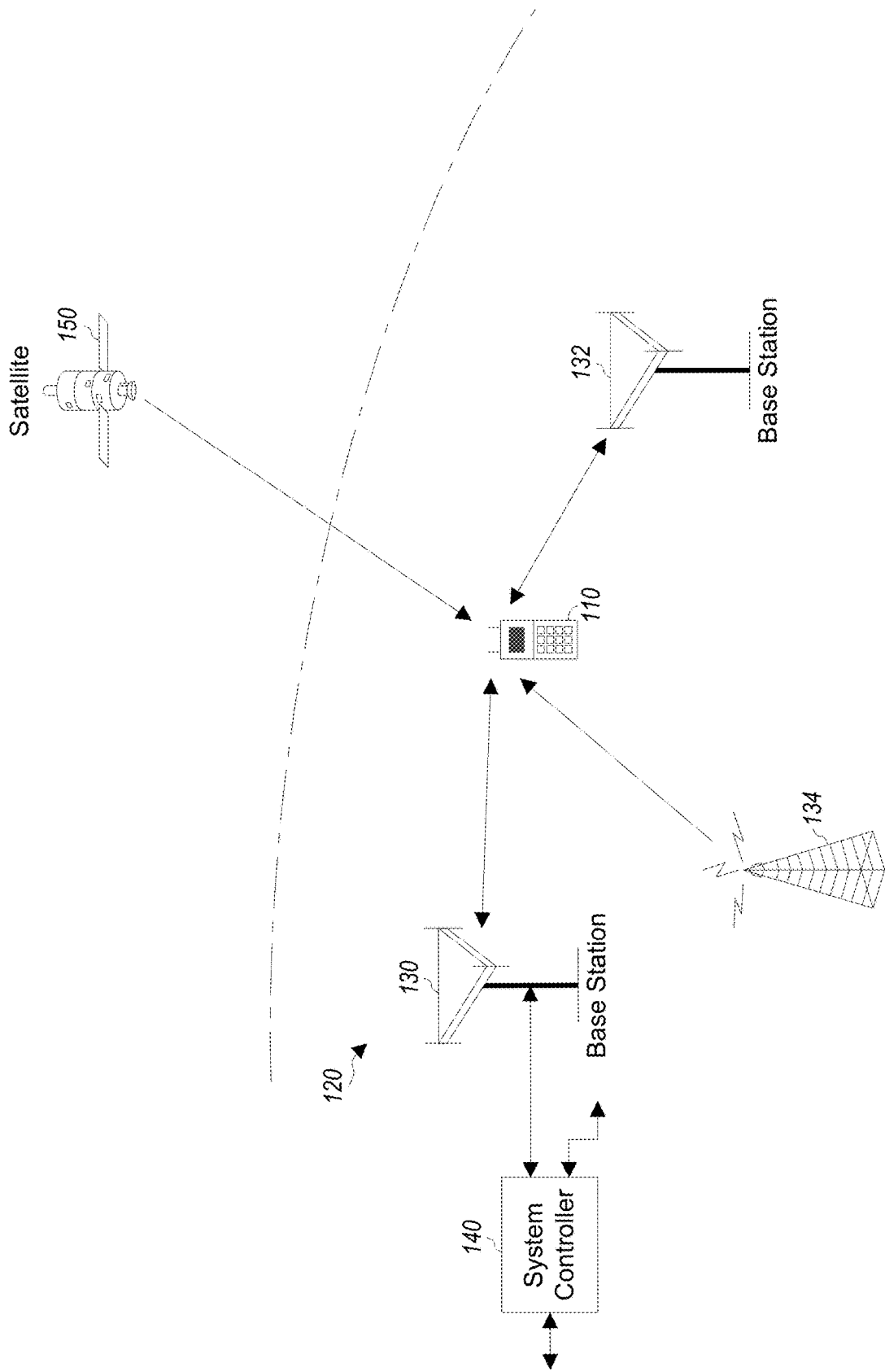
FIG. 1 shows a wireless device communicating with a wireless system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR" and the use of the term "or" is intended to represent an "exclusive OR".

Wireless communication systems generally demand high levels of integration, complex functionality, and low cost implementations. Amplifiers are commonly used in various electronics devices to provide signal amplification. Different types of amplifiers are available for different uses. For example, a wireless communication device (e.g., a cellular phone) may include a transmitter and a receiver for bi-directional communication. The receiver may use a low noise amplifier (LNA), while the transmitter may use a power amplifier (PA). The receiver may include a low noise amplifier coupled to an antenna via various front-end circuit blocks of a radio frequency (RF) front-end module.

In an RF receiver, an input signal from the antenna first passes through the LNA that amplifies the input signal, while suppressing noise contributions. As a result, a low noise figure (NF) and high gain are important LNA performance parameters. In particular, LNA designs involve tradeoffs among linearity, input matching, power dissipation, and the like. These tradeoffs may dictate the type of LNA topology that is selected. For example, a common source (CS) LNA is a type of LNA that is popular due to its noise performance. Conversely, a common gate (CG) LNA is a type of LNA that provides a wideband input match that is less sensitive to input parasitic capacitance.

Aggressive noise figure (NF) specifications impose using the common source LNA topology rather than the common gate topology. Unfortunately, stringent carrier aggregation (CA) mode receiver sensitivity involves high out-of-band (OOB) as well as adjacent channel selectivity (ACS) third order input intercept point (IIP3) compliance. This is a challenge in common source LNAs due to a nonlinearity of a current within the common source LNA topology. To improve linearity, a nonlinear portion of the current can be removed. For example, an auxiliary (low gain) path may generate a nonlinear current with the same magnitude as a main (high gain) path, but with an opposite sign to remove the nonlinear current.

According to aspects of the present disclosure, linearity within the CS LNA topology is improved by including a post distortion cancellation (PDC) block. The post distortion cancellation block may include a diode coupled in series with phase-shift logic. The phase-shift logic may include a resistor-capacitor (RC) circuit, in which the resistor and/or the capacitor are variable. With the help of phase-shift, the diode of the post distortion cancellation block can be sized and biased to generate the same third order intermodulation (IM3) magnitude as a main path (high gain branch) of the common source LNA. The IM3 magnitude exhibits an opposite sign as a nonlinear portion of a branch current for cancelling the nonlinear portion of the branch current. This diode configuration generates the IM3 magnitude, opposite signed current without substantially degrading the noise figure NF (e.g., by less than 0.03 dB, relative to previous solutions that exhibit more than 0.3 dB NF degradation).

According to aspects of the present disclosure, the post distortion cancellation block includes a first phase-shift cancellation block and a second phase-shift cancellation block. The first phase-shift cancellation block may be coupled to a high gain branch and the second phase-shift cancellation block may be coupled to a low gain branch of the low noise amplifier. While these locations of the post distortion cancellation block may be beneficial for canceling the nonlinearity of a main path of the low noise amplifier for a low-band and a mid-band, the location may be adjusted for high-band as well as ultra high-band. In this aspect of the present disclosure, the post distortion cancellation block may be provided at an output of the low noise amplifier.

The aspects of the present disclosure may be implemented in the systems of FIGS. 1, 2A-D, and 3.

FIG. 1 shows a wireless device 110 communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

In general, carrier aggregation (CA) may be categorized into two types: intra-band CA and inter-band CA. Intra-band CA refers to operation on multiple carriers within the same band and inter-band CA refers to operation on multiple carriers in different bands.

Figure 2A:
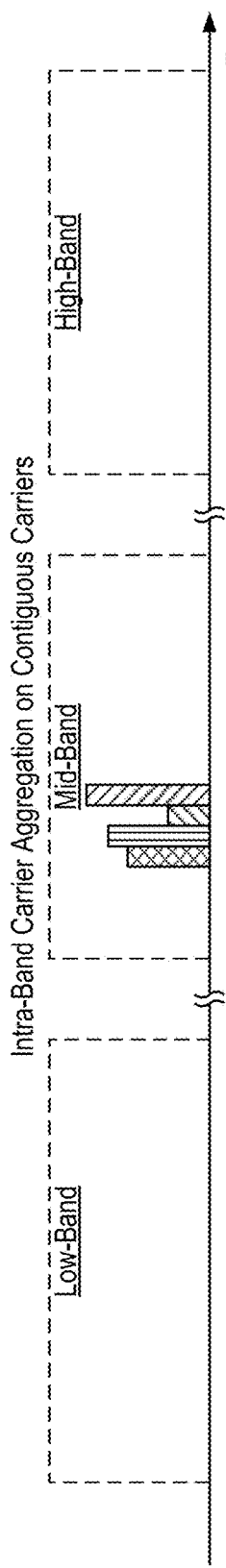
FIGS. 2A-2D show four examples of carrier aggregation (CA).

FIG. 2A shows an example of contiguous intra-band CA. In the example shown in FIG. 2A, a wireless device (e.g., the wireless device 110) is configured with four contiguous carriers in the same band, which is a band in mid-band. The wireless device may send and/or receive transmissions on multiple contiguous carriers within the same band.

Figure 2B:
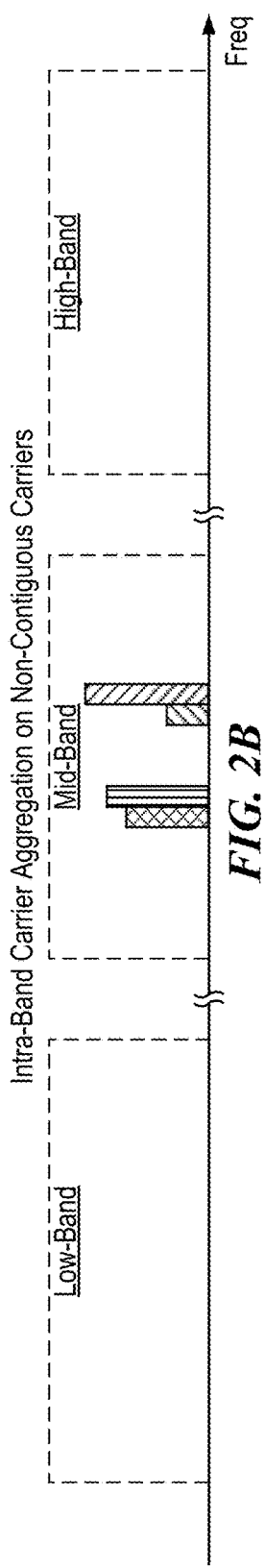

FIG. 2B shows an example of non-contiguous intra-band CA. In the example shown in FIG. 2B, a wireless device (e.g., the wireless device 110) is configured with four non-contiguous carriers in the same band, which is a band in mid-band. The carriers may be separated by 5 MHz, 10 MHz, or some other amount. The wireless device may send and/or receive transmissions on multiple non-contiguous carriers within the same band.

Figure 2C:
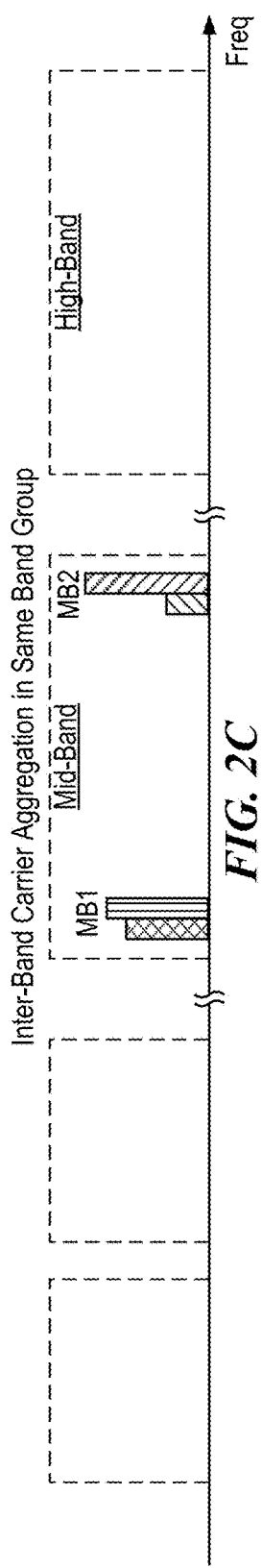

FIG. 2C shows an example of inter-band CA in the same band group. In the example shown in FIG. 2C, a wireless device (e.g., the wireless device 110) is configured with four carriers in two bands in the same band group, which is mid-band. The wireless device may send and/or receive transmissions on multiple carriers in different bands in the same band group (e.g., Mid-Band 1 (MB1) and Mid-Band 2 (MB2) in FIG. 2C).

Figure 2D:
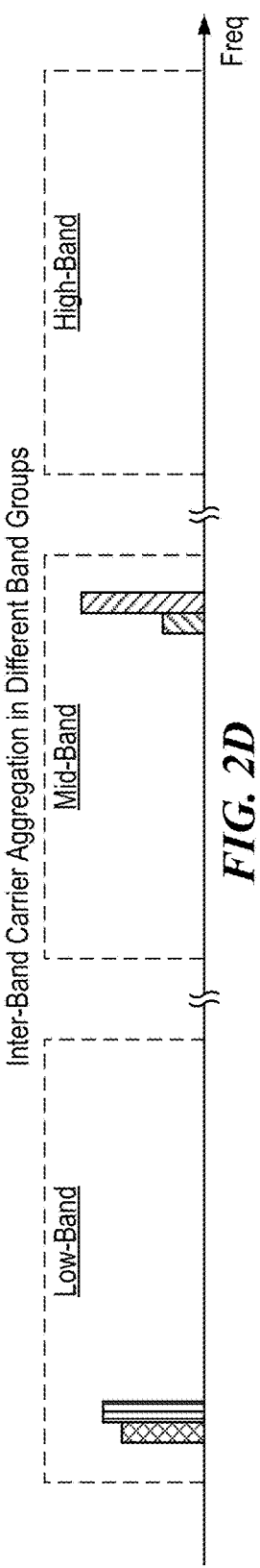

FIG. 2D shows an example of inter-band CA in different band groups. In the example shown in FIG. 2D, a wireless device (e.g., the wireless device 110) is configured with four carriers in two bands in different band groups, which include two carriers in one band in low-band and two additional carriers in another band in mid-band. The wireless device may send and/or receive transmissions on multiple carriers in different bands in different band groups (e.g., low-band and mid-band in FIG. 2D). FIGS. 2A to 2D show four examples of carrier aggregation. Carrier aggregation may also be supported for other combinations of bands and band groups. For example, carrier aggregation may be supported for low-band and high-band, mid-band and high-band, high-band and high-band, and other band combinations with ultra-high band and long-term evolution in unlicensed spectrum (LTE-U).

Figure 3:
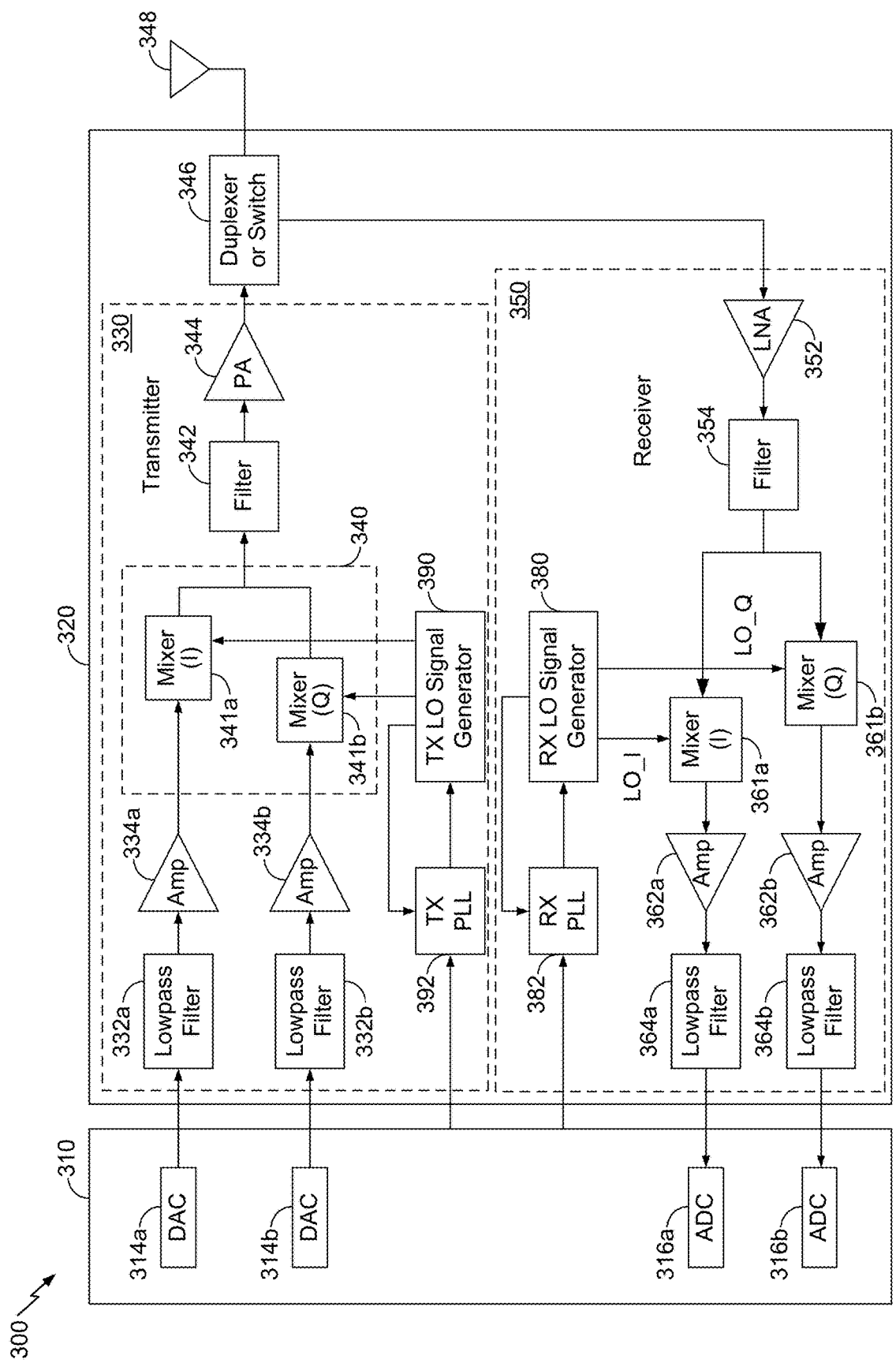
FIG. 3 shows a block diagram of the wireless device in FIG. 1.

FIG. 3 shows a block diagram of an exemplary design of a wireless device 300, such as the wireless device 110 shown in FIG. 1, which may include a radio frequency (RF) front-end module. FIG. 3 shows an example of a transceiver 320, which may be a wireless transceiver (WTR) of an RF front-end module. In general, the conditioning of the signals in a transmitter 330 and a receiver 350 may be performed by one or more stages of amplifier(s), filter(s), upconverters, downconverters, and the like. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, the wireless device 300 generally includes the transceiver 320 and a data processor 310. The data processor 310 may include a memory (not shown) to store data and program codes, and may generally include analog and digital processing elements. The transceiver 320 may include the transmitter 330 and receiver 350 that support bi-directional communication. In general, the wireless device 300 may include any number of transmitters and/or receivers for any number of communication systems and frequency bands. All or a portion of the transceiver 320 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 3, the transmitter 330 and the receiver 350 are implemented with the direct-conversion architecture.

In a transmit path, the data processor 310 processes data to be transmitted. The data processor 310 also provides in-phase (I) and quadrature (Q) analog output signals to the transmitter 330 in the transmit path. In an exemplary aspect, the data processor 310 includes digital-to-analog-converters (DACs) 314a and 314b for converting digital signals generated by the data processor 310 into the in-phase (I) and quadrature (Q) analog output signals (e.g., I and Q output currents) for further processing.

Within the transmitter 330, lowpass filters 332a and 332b filter the in-phase (I) and quadrature (Q) analog transmit signals, respectively, to remove undesired images caused by the prior digital-to-analog conversion. Amplifiers (Amp) 334a and 334b amplify the signals from lowpass filters 332a and 332b, respectively, and provide in-phase (I) and quadrature (Q) baseband signals. An upconverter 340 upconverts the in-phase (I) and quadrature (Q) baseband signals with in-phase (I) and quadrature (Q) transmit (TX) local oscillator (LO) signals from a TX LO signal generator 390 to provide an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit radio frequency signal. The transmit radio frequency signal is routed through a duplexer/switch 346 and transmitted via an antenna 348.

In a receive path, the antenna 348 receives communication signals and provides a received radio frequency (RF) signal, which is routed through the duplexer/switch 346 and provided to a low noise amplifier (LNA) 352. The duplexer/switch 346 is designed to operate with a specific receive (RX) to transmit (TX) (RX-to-TX) duplexer frequency separation, such that RX signals are isolated from TX signals. The received RF signal is amplified by the low noise amplifier 352 and filtered by a filter 354 to obtain a desired RF input signal. Downconversion mixers 361a and 361b mix the output of the filter 354 with in-phase (I) and quadrature (Q) receive (RX) LO signals (i.e., LO_I and LO_Q) from an RX LO signal generator 380 to generate in-phase (I) and quadrature (Q) baseband signals. The in-phase (I) and quadrature (Q) baseband signals are amplified by amplifiers 362a and 362b and further filtered by lowpass filters 364a and 364b to obtain in-phase (I) and quadrature (Q) analog input signals, which are provided to the data processor 310. In the exemplary configuration shown, the data processor 310 includes analog-to-digital-converters (ADCs) 316a and 316b for converting the analog input signals into digital signals for further processing by the data processor 310.

In FIG. 3, the transmit local oscillator (TX LO) signal generator 390 generates the in-phase (I) and quadrature (Q) TX LO signals used for frequency upconversion, while a receive local oscillator (RX LO) signal generator 380 generates the in-phase (I) and quadrature (Q) RX LO signals used for frequency downconversion. Each LO signal is a periodic signal with a particular fundamental frequency. A phase locked loop (PLL) 392 receives timing information from the data processor 310 and generates a control signal used to adjust the frequency and/or phase of the TX LO signals from the TX LO signal generator 390. Similarly, a PLL 382 receives timing information from the data processor 310 and generates a control signal used to adjust the frequency and/or phase of the RX LO signals from the RX LO signal generator 380.

The wireless device 300 may support carrier aggregation and may (i) receive multiple downlink signals transmitted by one or more cells on multiple downlink carriers at different frequencies and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

A power amplifier 344 may include one or more stages having, for example, driver stages, power amplifier stages, or other components, that can be configured to amplify a communication signal on one or more frequencies, in one or more frequency bands, and at one or more power levels. Depending on various factors, the power amplifier can be configured to operate using one or more bias signals.

A bias circuit establishes parameters under which a communication signal is amplified by a power amplifier 344. Correctly biasing the power amplifier 344 is desirable so that the communication signal is appropriately amplified and transmitted to support communication enhancements, such as carrier aggregation. In particular, support for carrier aggregation involves power amplifier operation in both a high power range and a low power range. For example, a high current bias may be specified to enhance linearity for the high power range. To achieve high efficiency over the desired power range, however, a low current bias may be specified for the lower power range.

A wireless communication system, including the wireless device 300, involves high levels of integration, complex functionality, and low cost implementations. Various amplifiers, which are available for different uses, are used in the wireless device 300 to provide signal amplification. In the configuration shown in FIG. 3, the wireless device 300 (e.g., a cellular phone) includes the transmitter 330 and the receiver 350 for bi-directional communication. The receiver 350 includes a low noise amplifier (LNA) 352, while the transmitter 330 includes a power amplifier (PA) 344. In the receiver 350, the low noise amplifier 352 is coupled to the antenna 348 through a duplexer 346.

In the receiver 350, an input signal from the antenna 348 passes through the low noise amplifier 352 that amplifies the input signal, while suppressing noise contributions. These noise contributions may be due to a lack of linearity, which results in artificial harmonics as well an intermodulations (IMn). Linearity may refer to the relationship between an input signal x, an output signal y, and a transfer function A, which refers to the gain of the low noise amplifier 352. While the input signal x and the output signal y may generally exhibit a linear behavior when powers of these values are small, when powers of these values are large, non-linearity is exacerbated. In particular, the low noise amplifier 352 may saturate when the powers of the input signal x and the output signal y are large, such that the output signal y no longer responds to further increases in the input signal x.

Unfortunately, substantial non-linearity results in the generation of multiple frequencies in the output signal y that were not present in the input signal x, in the form of artificial harmonics that are responsible for signal distortion and noise. In addition, arithmetic combinations between the input signal and the artificial harmonics are referred to as intermodulation products (IM). These intermodulation products may include second-order intermodulation products (IM2), third-order intermodulation products (IM3), up to an nth-order intermodulation product (IMn).

The transfer function A is responsible for device nonlinearity, such that the larger the transfer function value A (e.g., A1, A2, . . . , Ai, . . . , An), the larger the distortion. The crossing points between the intermodulation products and an ideal transfer function (e.g., A1x) are referred to as intercept points (IPn), such that the point where first-order and second-order lines cross is IP2, and the point where the first order lines and the third order lines cross is IP3. In practice, two values are used for measuring the intercept point: IIPn for the nth-order intercept point, as measured on an input power axis (x); and OIPn for the nth-order intercept point, as measured on an output power axis (y).

While the filter 354 may be used to remove some of the intermodulation products, third-order intermodulation products IM3 may be embedded in the useful band. Failure to remove the intermodulations may degrade a noise figure (NF) and prevent high gain, which are important LNA performance parameters. In particular, LNA designs involve tradeoffs among linearity, input matching, power dissipation, and the like. These tradeoffs may dictate the type of LNA topology that is selected. For example, a common source (CS) LNA or a common gate (CG) LNA may be selected.

Those skilled in the art will recognize that aspects described may be implemented in receiver architectures that differ from the architecture illustrated in FIG. 3.

Figure 4:
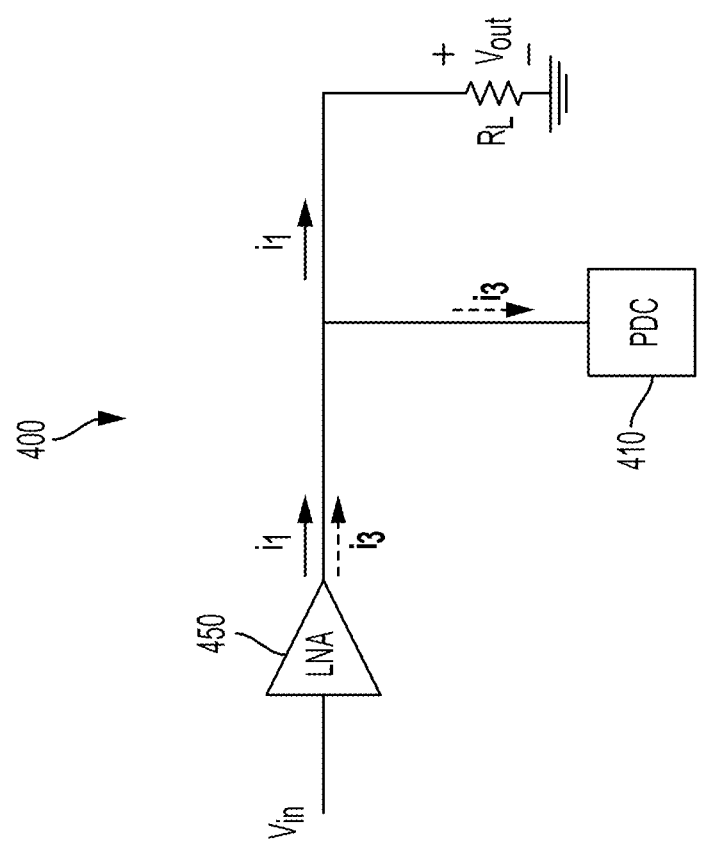
FIG. 4 is a block diagram illustrating an RF receiver including a low noise amplifier and a post distortion cancellation (PDC) block, according to aspects of the present disclosure.

FIG. 4 is a block diagram illustrating an RF receiver 400 including a low noise amplifier 450 and a post distortion cancellation block 410 (PDC), according to aspects of the present disclosure. Aggressive noise figure specifications may impose using a common source LNA topology rather than the common gate topology for the low noise amplifier

450. Unfortunately, stringent carrier aggregation (CA) mode receiver sensitivity involves high out-of-band (OOB) as well as adjacent channel selectivity (ACS) third order input intercept point (IIP3) compliance. Compliance is a challenge in common source LNAs due to a nonlinearity of a current within the common source LNA topology.

In the configuration shown in FIG. 4, linearity in the RF receiver is improved by removing a nonlinear portion of the current ($i_1$). In this example, the post distortion cancellation block 410 provides an auxiliary (low gain) path. The post distortion cancellation block 410 may generate a nonlinear current ($i_3$) of a same magnitude as a main (high gain) path current ($i_1$), but with an opposite sign to remove the nonlinear current $i_3$ from the main path current $i_1$ generated by the low noise amplifier 450 in response to the input voltage ($v_{in}$). As a result, an output voltage ($v_{out} = i_1 * R_L$) generally maintains a linear relationship with the input voltage $v_{in}$.

Figure 5:
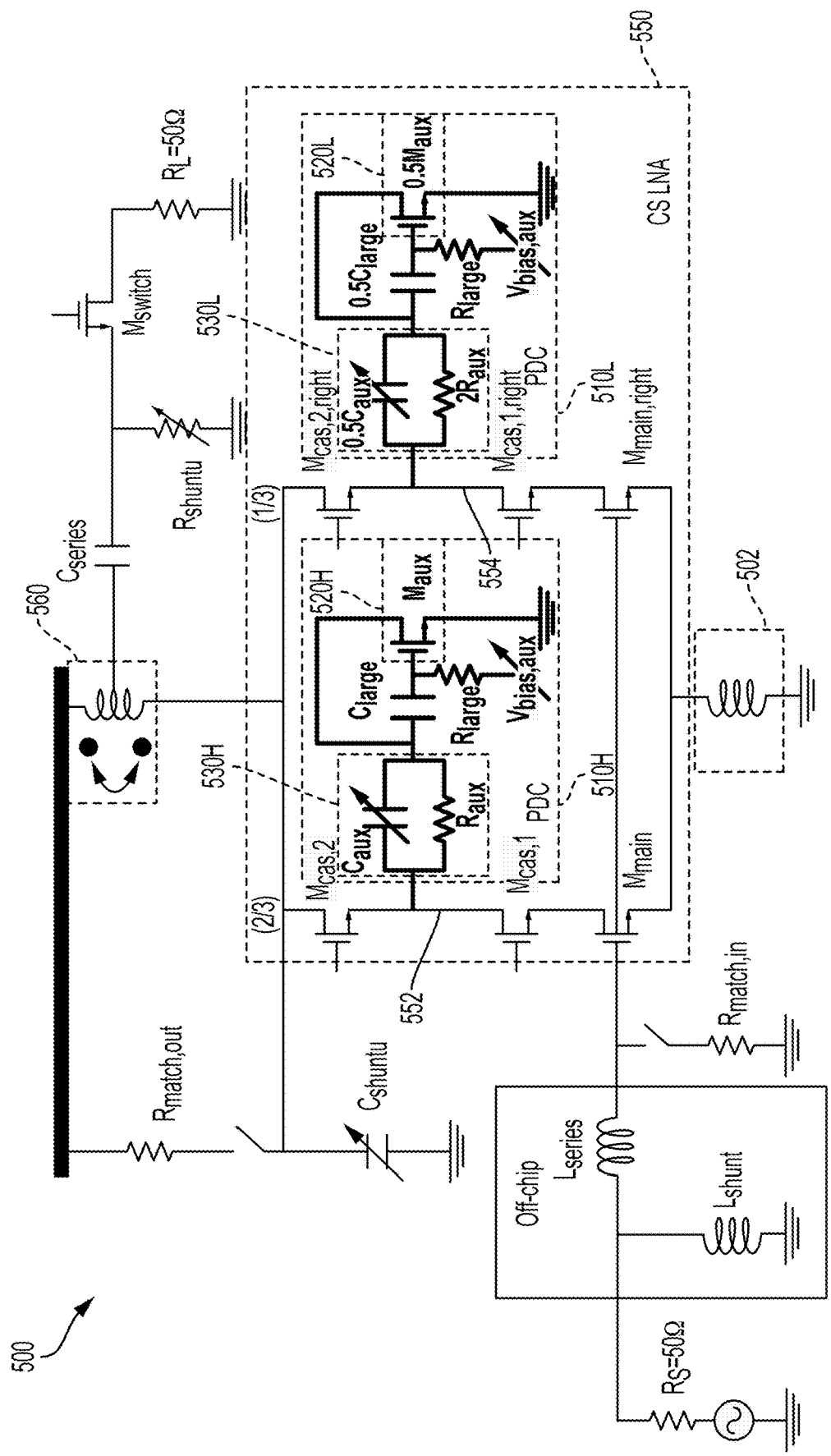
FIG. 5 illustrates an RF receiver, in which linearity within a common source LNA topology is improved by including post distortion cancellation blocks, according to aspects of the present disclosure.

FIG. 5 illustrates an RF receiver 500, in which linearity within a common source LNA topology is improved by including post distortion cancellation (PDC) blocks, according to aspects of the present disclosure. Representatively, the common source LNA topology 550 is a two branch LNA, including a high gain branch 552 and a low gain branch 554, which may be used in place of the low noise amplifier 352 shown in FIG. 3. In this arrangement, a first post distortion cancellation block 510H may include a diode 520H (e.g., a diode coupled transistor) coupled in series with a phase-shift logic 530H through a resistor $R_{large}$ and a capacitor $C_{large}$. The phase-shift logic 530H may include a resistor-capacitor (RC) filter or circuit (e.g., $C_{aux}$ and $R_{aux}$), in which the resistor $R_{aux}$ (and/or the capacitor $C_{aux}$ are variable for setting the phase of the signal for cancellation. Vbias, aux provides a bias for the diode 520H and/or the diode 520L to obtain a desired signal amplitude for cancelling the nonlinear current.

In this configuration, the phase-shift logic 530H enables sizing and biasing of the diode 520H of the first post distortion cancellation block 510H for generating the same third order intermodulation (IM3) magnitude as a high gain branch 552 (e.g., main path) of the common source LNA topology 550. The IM3 magnitude exhibits an opposite sign as a nonlinear portion of a branch current for canceling the nonlinear portion of the branch current, for example, as shown in FIG. 4. This configuration of the diode 520H generates the IM3 magnitude, opposite signed current without substantially degrading the noise figure NF (e.g., by less than 0.03 dB).

In this aspect of the present disclosure, the post distortion cancellation block may include a first phase-shift cancellation block as the first post distortion cancellation block 510H, and a second phase-shift cancellation block as the second post distortion cancellation block 510L. The first post distortion cancellation block 510H is coupled to the high gain branch 552 and the second post distortion cancellation block 510L is coupled to a low gain branch 554 of the common source LNA topology 550. In operation, the high gain branch 552 and the low gain branch 554 are both active for high gain mode. That is, in high-gain mode both branches (e.g., 522 and 554) are working and the first post distortion cancellation block 510H is active to cancel the IM3 current generated by both the high gain branch 552 and the low gain branch 554. In low-gain mode, only the low gain branch 554 is active, such that the second post distortion cancellation block 510L is active to cancel the IM3 current generated by the low gain branch 554.

In one configuration, the diode 520H of the first post distortion cancellation block 510H is biased in the moderate inversion right after the third order transconductance (gm3) sweet spot and phase is set by selecting the values of the resistor and the capacitor. As a result, the diode 520H generates enough IM3 current with the correct phase to cancel the IM3 on the high gain path, while not generating a large main tone current. In this configuration, the diode 520H does not disturb the gain of the common source LNA topology 550. The diode 520L may be similarly configured; however, the diode 520L should be half the size of the diode 520H because the low-gain branch is half the size of the high-gain branch. In addition, a capacitance value of a bias capacitor ($0.5 C_{large}$) is half the value of the bias capacitor $C_{large}$ of the diode 520H. In addition, a capacitance value of the phase-shift logic 530L is half the capacitance value of the phase-shift logic 530H, and a resistance value ($2R_{aux}$) is twice the resistance value of the phase-shift logic 530H.

The common source LNA topology 550 of the RF receiver 500 also includes an amplifier transistor $M_{main}$ as well as current buffer transistors (e.g., $M_{cas,1}$ and $M_{cas,2}$) in the high gain branch 552, which contributes ⅔ of the LNA gain. The common source LNA topology 550 further includes an amplifier transistor $M_{main,right}$ as well as current buffer transistors (e.g., $M_{cas,1,right}$ and $M_{cas,2,right}$) in the low gain branch 554, which contributes ⅓ of the LNA gain. The RF receiver 500 further includes an antenna (e.g., as represented by a source resistor $R_S$), an off-chip block including a pair of inductors ($L_{series}$ and $L_{shunt}$), and an input matching resistor ($R_{match,in}$).

The common source LNA topology 550 of the RF receiver 500 is coupled between a degeneration inductor 502 and a transformer 560. The transformer 560 is coupled to a shunt resistor $R_{shuntu}$, a switch transistor $M_{switch}$, and a load resistor $R_L$. The transformer 560 is also coupled to a matching output resistor $R_{match,out}$ and a shunt capacitor $C_{shuntu}$. The shunt capacitor $C_{shuntu}$ and shunt resistor $R_{shuntu}$ may support matching when switching between bands. The transformer 560 changes impedance while maintaining power. While these components are shown as separate components from the common source LNA topology 550, these components may also be incorporated within the common source LNA topology 550 according to aspects of the present disclosure. This configuration of the RF receiver 500 provides a multi-band third-order intercept input point (IIP3) improvement.

Configuration of the post distortion cancellation blocks may be extended to different bands (e.g., low-band (LB), mid-band (MB), high-band (HB), ultra high-band (UHB), and LTE unlicensed band (LTE-U)) by designing resistance and capacitance values in the phase shift logic (e.g., 530H and 530L) for each band. The phase shift logic may provide a first phase-shift cancellation block and a second phase-shift cancellation block for the first post distortion cancellation block 510H and the second post distortion cancellation block 510L.

The common source LNA topology 550 eliminates interference between a main path (e.g., the high gain branch 552 and the low gain branch 554) and an auxiliary path of the first post distortion cancellation block 510H and the second post distortion cancellation block 510L. Advantageously, the main path and all the other components of the common source LNA topology 550 can be designed without considering linearity or the auxiliary path. As a result, the design of the main path and other LNA components may focus on meeting noise figure (NF), gain, matching, and current consumption specifications.

Similarly, the auxiliary path can be designed to improve linearity by leveraging the phase shift logic (e.g., 530H and 530L), which will not degrade the gain, noise figure (NF), matching, or current consumption of the common source LNA topology 550. This reduces LNA design complexity and optimization can be performed separately between the main path and the auxiliary path of the common source LNA topology 550. In addition, no extra RF routing to the transformer 560 is involved because the nonlinear current portion is removed locally, which reduces floor-plan complexity, but does not degrade the matching of the RF receiver 500.

The locations of the first post distortion cancellation block 510H and the second post distortion cancellation block 510L may be beneficial for canceling the nonlinearity of the high gain branch 552 (e.g., main path) of the common source LNA topology 550 for a low-band and a mid-band. A post distortion cancellation block location, however, may be adjusted for high-band as well as ultra high-band. In this aspect of the present disclosure, the post distortion cancellation block may be provided at an output of the common source LNA topology 550, for example, as shown in FIG. 6.

Figure 6:
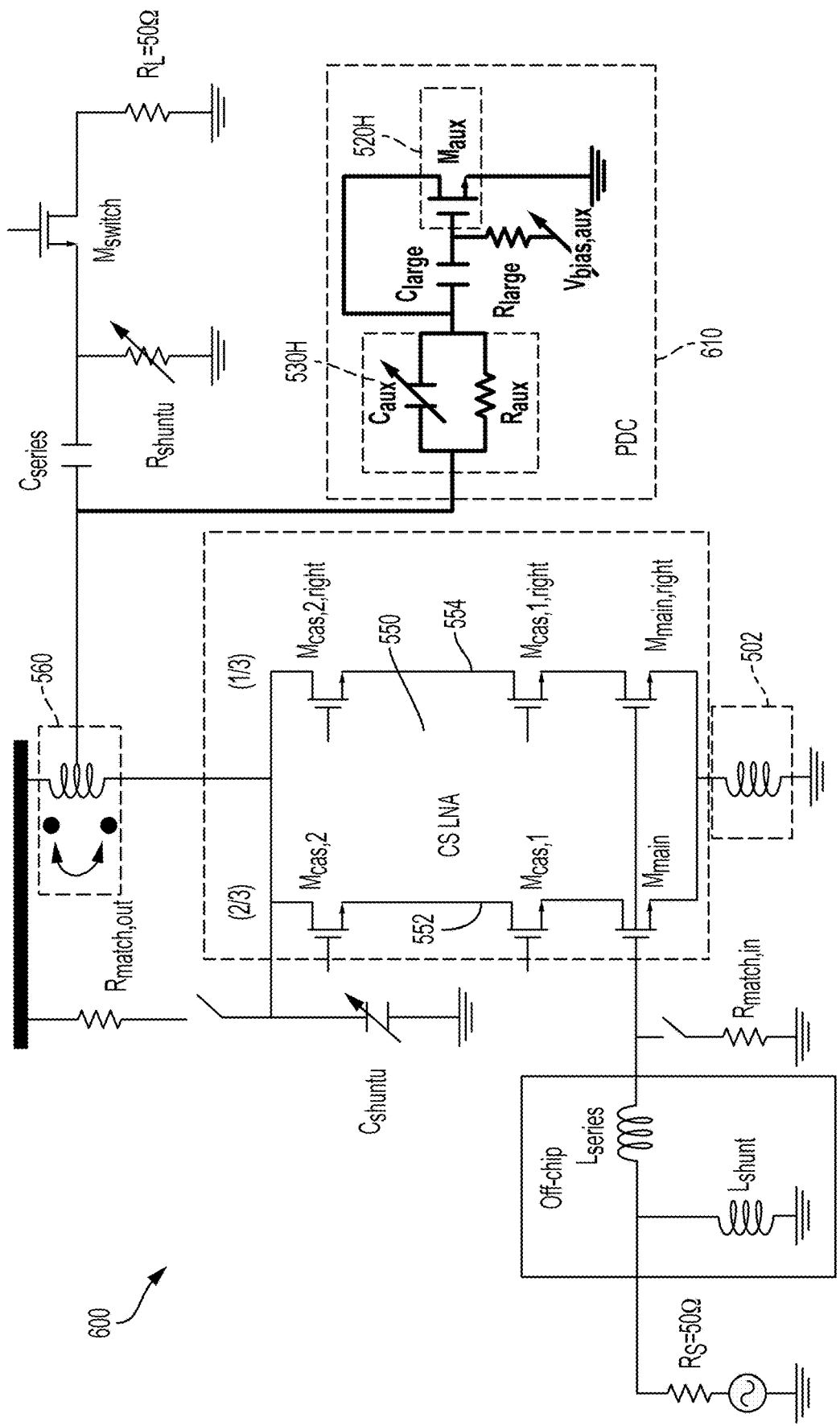
FIG. 6 illustrates an RF receiver, in which linearity within a common source LNA topology is improved by including an output post distortion cancellation block, according to aspects of the present disclosure.

FIG. 6 illustrates an RF receiver 600, in which linearity within a common source LNA topology is improved by including an output post distortion cancellation (PDC) block, according to aspects of the present disclosure. The configuration of the RF receiver 600 is similar to the configuration of the RF receiver 500 shown in FIG. 5. In FIG. 5, the first post distortion cancellation block 510H and the second post distortion cancellation block 510L cancel a nonlinearity of the main and the first cascode devices ($M_{main}$ and $M_{casc.1}$) and partially the nonlinearity of the second cascode ($M_{casc.2}$) of the high gain branch 552. The first cascode ($M_{cas.1}$) may be a first cascode transistor and the second cascode ($M_{casc.2}$) of the high gain branch 552 may be a second cascode transistor.

While the common source LNA topology 550 of FIG. 5 shows promising improvements at LB (low band) and MB (mid-band), and HB (high-band), it is not as effective. At ultra high-band (UHB), however, the configuration of the first post distortion cancellation block 510H and the second post distortion cancellation block 510L may fail to achieve positive third order input intercept point (IIP3) numbers. This may be due to parasitic capacitance, which becomes more disruptive and causes further reliance on cascode2 ($M_{cas.2}$) to achieve the desired gain. At higher frequencies (e.g. UHB), transconductance (gm) and output impedance (gds) nonlinearity of the second cascode2 ($M_{cas.2}$) further contribute to the total nonlinearity of the LNA.

In the configuration shown in FIG. 6, an output post distortion cancellation block 610 is tapped to an output node of the transformer 560 according to aspects of the present disclosure. This arrangement of the RF receiver 600 improves nonlinearity cancellation because a larger amount of voltage is available at the output node of the transformer 560. The increased voltage makes it more effective to tap the output post distortion cancellation block 610 at an output of a transformer 560 relative to tapping below cascode2 ($M_{cas.2}$), as shown in FIG. 5. The increased voltage is useful at higher frequencies where common source output impedance (gds) nonlinearity of the cascode2 ($M_{cas.2}$) provides a further contribution to nonlinearity of the common source LNA topology 550. While the output node of the transformer 560 is a low impedance node, similar to the source of the cascode2 ($M_{cas.2}$), the output post distortion cancellation block 610 at the output node of the transformer 560 is more sensitive to variations compared to the first post distortion cancellation block 510H at the source of the cascode2 ($M_{cas.2}$), as shown in FIG. 5.

Placement of the output post distortion cancellation block 610 at the output node of the transformer 560, as shown in FIG. 6, is effective for cancelling nonlinearity caused by different sources relative to the configuration shown in FIG. 5. The different sources of nonlinearity include transconductance (gm) of the main device ($M_{main}$) as well as transconductance and output impedance (gds) nonlinearity of the cascode2 ($M_{cas.2}$). Placement of the output post distortion cancellation block 610 at the output node of the transformer 560 is effective for cancelling nonlinear current and achieving improved linearity in a certain range of jammer power (e.g., third order input intercept point (IIP3) adjacent channel selectivity (ACS) (IIP3ACS)). This placement of the output post distortion cancellation block 610 at the output node of the transformer 560, however, provides a limited improvement if a jammer power is out of range, such as a transmitter (Tx) jammer larger than −20 dBm.

Figure 7:
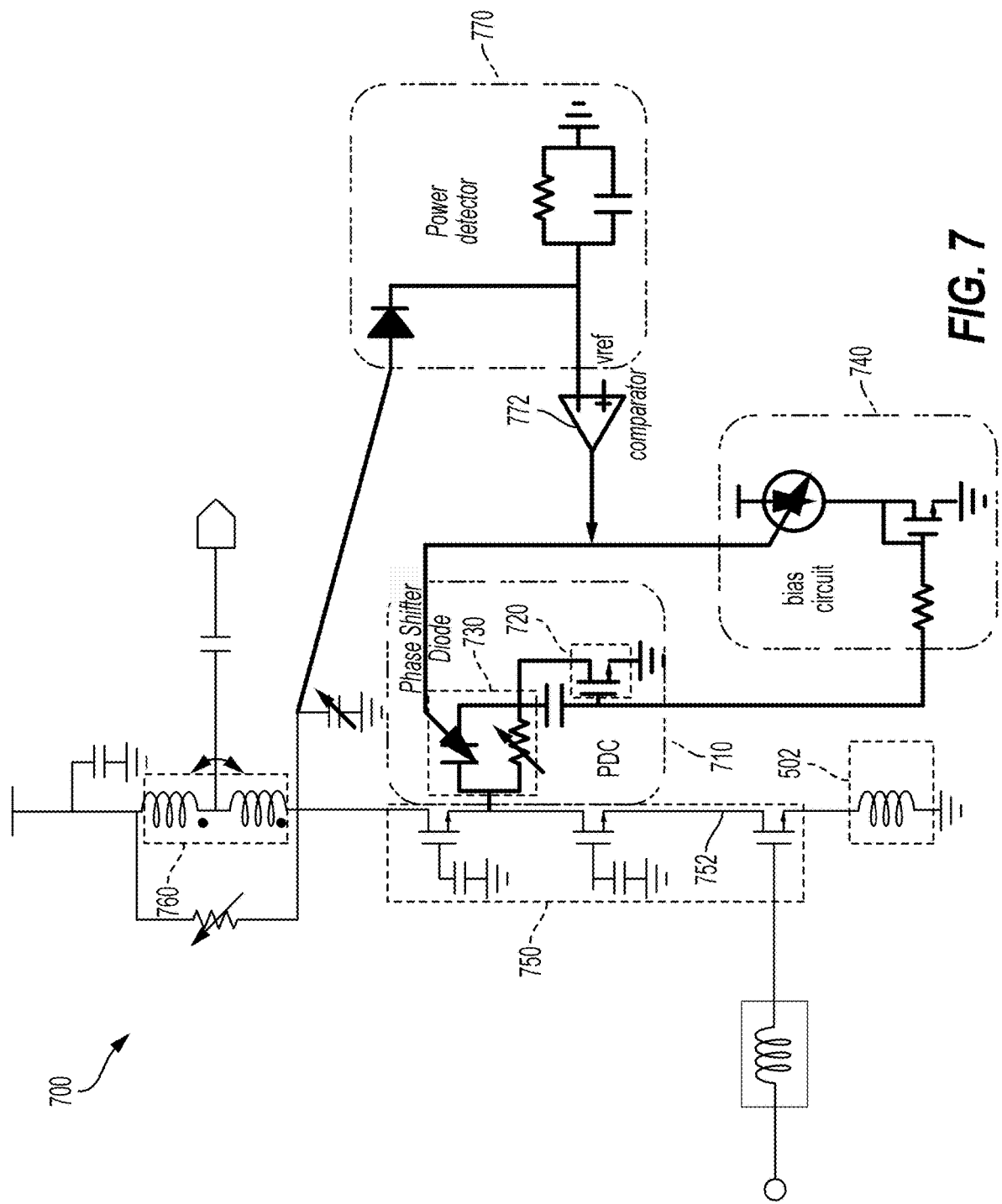
FIG. 7 illustrates an RF receiver, in which linearity within a common source low noise amplifier (LNA) topology is improved by providing jammer sensitive tuning of a post distortion cancellation block, according to aspects of the present disclosure.

FIG. 7 illustrates an RF receiver 700, in which linearity within a common source LNA topology is improved by providing jammer sensitive tuning of a post distortion cancellation (PDC) block, according to aspects of the present disclosure. The configuration of the RF receiver 700 is similar to the configuration shown in FIG. 5, in which a post distortion cancellation block 710 is tapped to a high gain branch 752 of a common source LNA topology 750. For the purpose of illustration, however, only a portion of the common source LNA topology 750 is shown. In addition, similar elements are shown with similar reference numbers and are not further discussed.

In the configuration shown in FIG. 7, the post distortion cancellation block 710 includes a diode 720 coupled in series with phase-shift logic 730 through a resistor and a capacitor. The phase-shift logic 730 includes a resistor-capacitor (RC) circuit, in which the resistor and/or the capacitor are variable. While the post distortion cancellation block 710 is effective for removing the nonlinear current from the high gain branch 752 for a certain range of jammer power, nonlinear current removal may be diminished when the jammer power exceeds the noted range. According to aspects of the present disclosure, a power detector 770 may detect an excess jammer power condition when the jammer power is outside a predetermined jammer power range.

In this configuration, the power detector 770 is coupled to an input of a transformer 760 for detecting an excess jammer power condition. For example, the power detector 770 is configured to detect a low power jammer condition and a high power jammer condition. In this example, a low power bias setting and a low power resistance-capacitance setting may be associated with the low power jammer condition. In addition, a high power bias setting and a high power resistance-capacitance setting may be associated with the high power jammer condition. Using a comparator 772 and a reference voltage Vref, the power detector 770 may program a resistance-capacitance setting of the phase-shift logic 730. The phase-shift logic 730 is programmed to either the low power resistance-capacitance setting or the high power resistance-capacitance setting depending on the detected condition.

In this configuration, a bias circuit 740 programs a bias setting of the diode 720 to either the low power bias setting or the high power bias setting in response to a switch signal sent by the power detector 770 according to the detected jammer power condition. As a result, adding the power detector 770, the comparator 772, and the bias circuit 740 to the RF receiver 700 provides jammer sensitive tuning. Depending on a detected jammer power condition, programming of the bias and RC setting of the post distortion cancellation block 710 improves linearity of the RF receiver 700 for a wide range of jammer power. This configuration, however, may be improved by providing additional reference voltages Vref, for example, as shown if FIG. 8.

Figure 8:
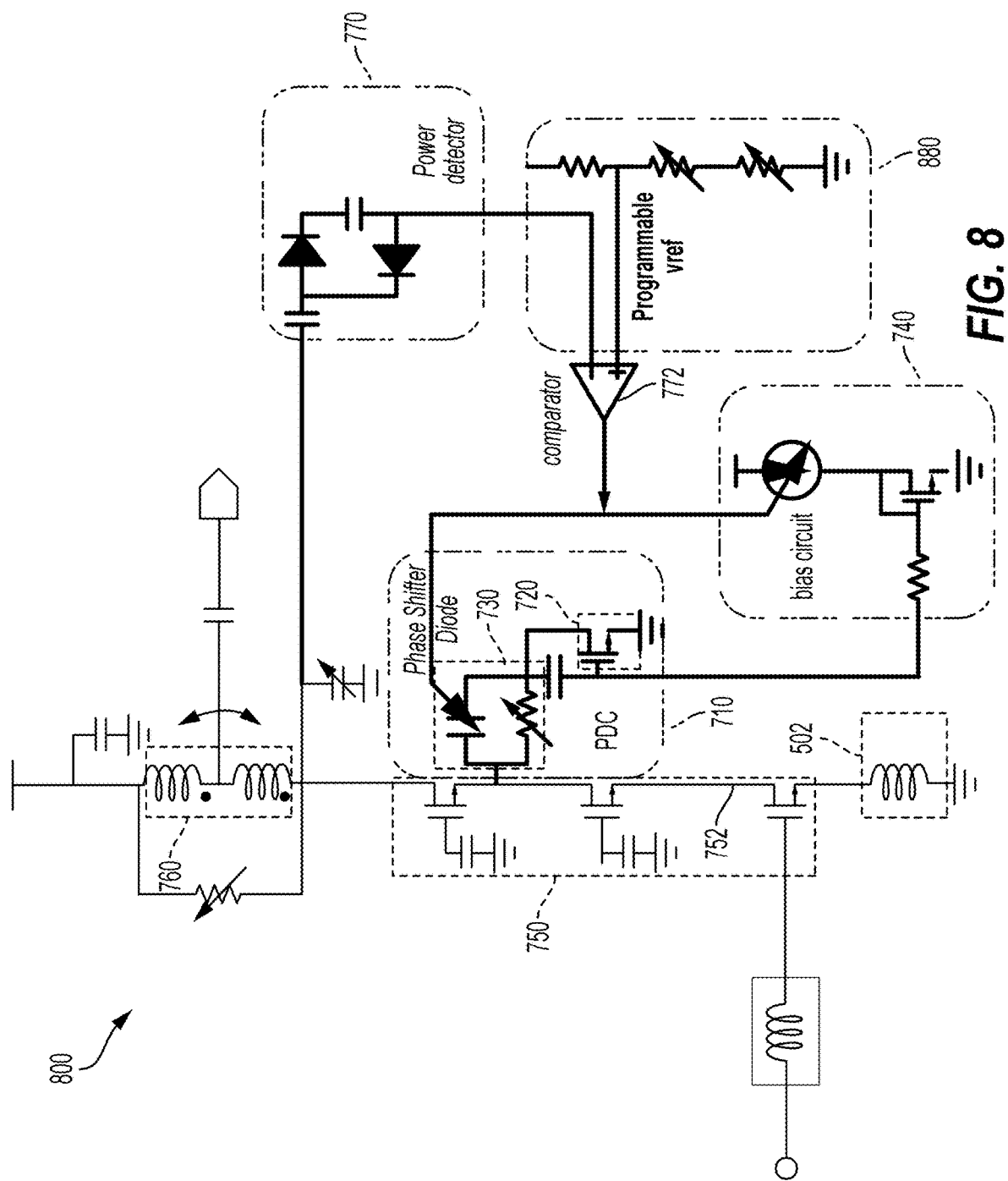
FIG. 8 illustrates an RF receiver, in which linearity within a common source LNA topology is further improved by providing jammer sensitive tuning of a post distortion cancellation block, according to aspects of the present disclosure.

FIG. 8 illustrates an RF receiver 800, in which linearity within a common source LNA topology is further improved by providing jammer sensitive tuning of a post distortion cancellation block, according to aspects of the present disclosure. The configuration of the RF receiver 800 is similar to the configuration shown in FIG. 7. Representatively, the power detector 770, the comparator 772, and the bias circuit 740 of the RF receiver 800 program settings of the post distortion cancellation block 710 to improve linearity of common source LNA topology 750 for a wider range of jammer power. In this configuration, programmability of the post distortion cancellation block 710 is improved by providing a programmable reference voltage vref logic 880. The programmable reference voltage vref logic 880 can be used to decide which jammer power is used as a predetermined threshold for switching between the bias and resistance-capacitance settings.

Figure 9:
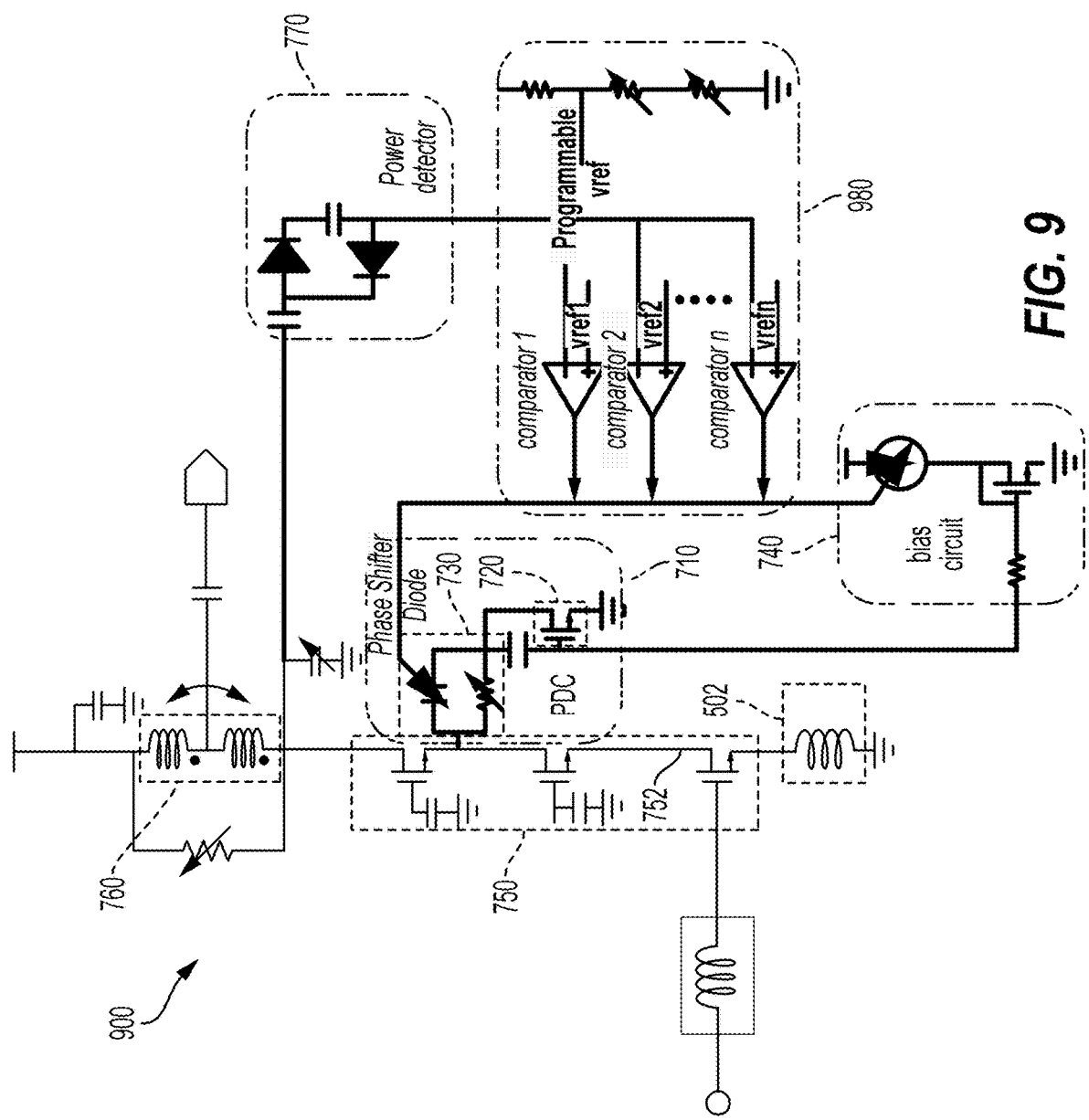
FIG. 9 illustrates an RF receiver, in which linearity within a common source LNA topology is further improved by supporting a wider range of jammer sensitive tuning for a post distortion cancellation block, according to aspects of the present disclosure.

FIG. 9 illustrates an RF receiver 900, in which linearity within a common source LNA topology is further improved by supporting a wider range of jammer sensitive tuning using a post distortion cancellation block, according to aspects of the present disclosure. The configuration of the RF receiver 900 is similar to the configuration shown in FIG. 8. In this configuration, programmability of the post distortion cancellation block 710 is further improved by providing a programmable reference voltage vref logic 980. The programmable reference voltage vref logic 980 includes multiple comparators (e.g., comparator 1, comparator 2, . . . , comparator n) for supporting multiple bias and resistance-capacitance settings. In this configuration, the multiple comparators are implemented with a stepped reference voltage Vref (e.g., vref1, vref2, . . . , vrefn) to detected stepped levels of j ammer power. Based on a comparator output, bias and resistance-capacitance settings can be adjusted to further improve linearity of a wider range of jammer power levels.

Figure 10:
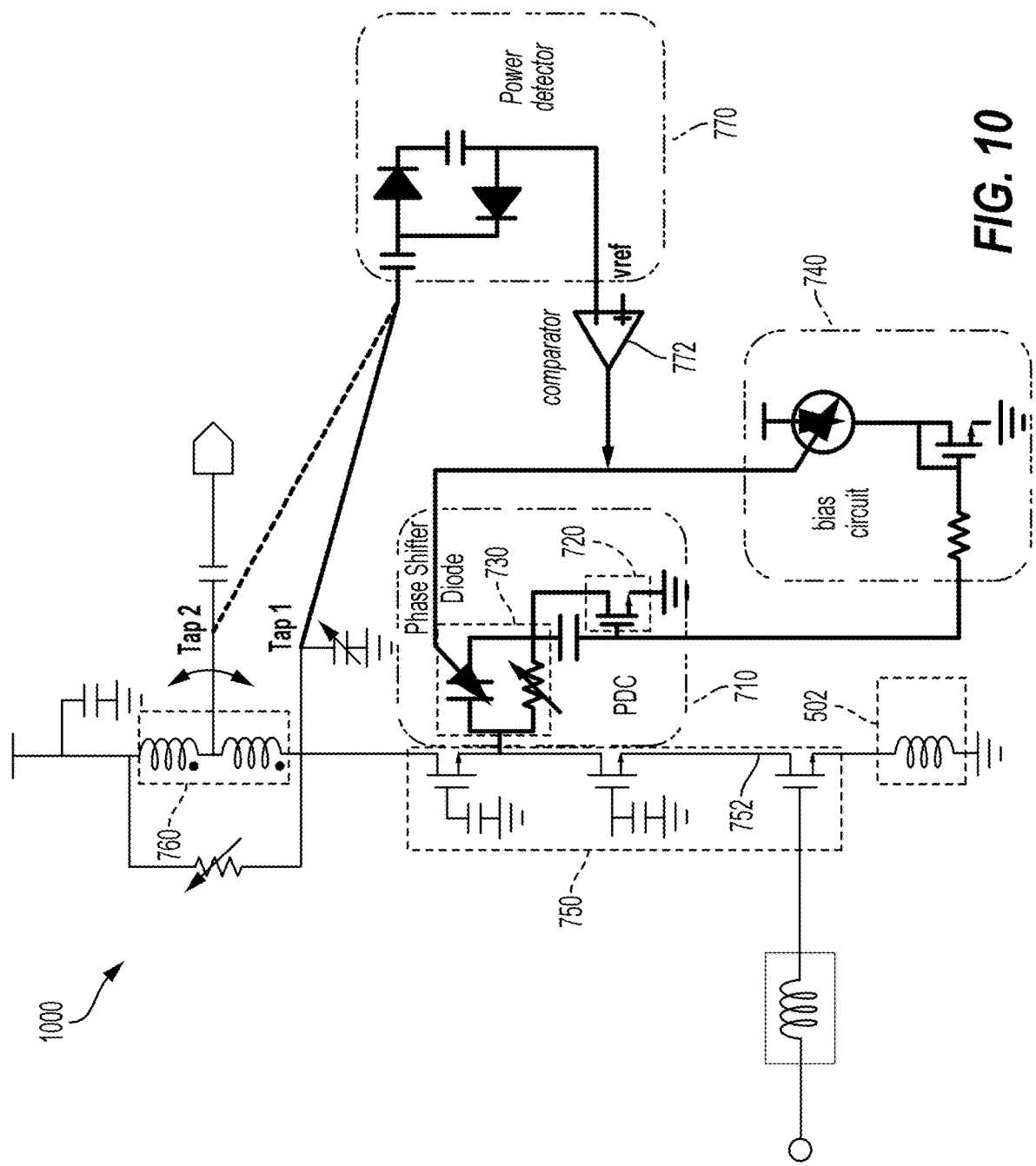
FIG. 10 illustrates an RF receiver, in which linearity within a common source LNA topology is further improved by switching a tapping point of a post distortion cancellation block, according to aspects of the present disclosure.

FIG. 10 illustrates an RF receiver 1000, in which linearity within a common source LNA topology is further improved by switching a tapping point of a post distortion cancellation block, according to aspects of the present disclosure. The configuration of the RF receiver 1000 is similar to the configuration shown in FIG. 7. In this configuration, a tapping point of the post distortion cancellation block 710 is switched between an input node and an output node of the transformer 760. Variation of the tapping point of the post distortion cancellation block 710 does not degrade performance of the common source LNA topology 750. As a result, complexity of the RF receiver 1000 is improved by the flexibility in switching the tapping point of the post distortion cancellation block 710.

Figure 11:
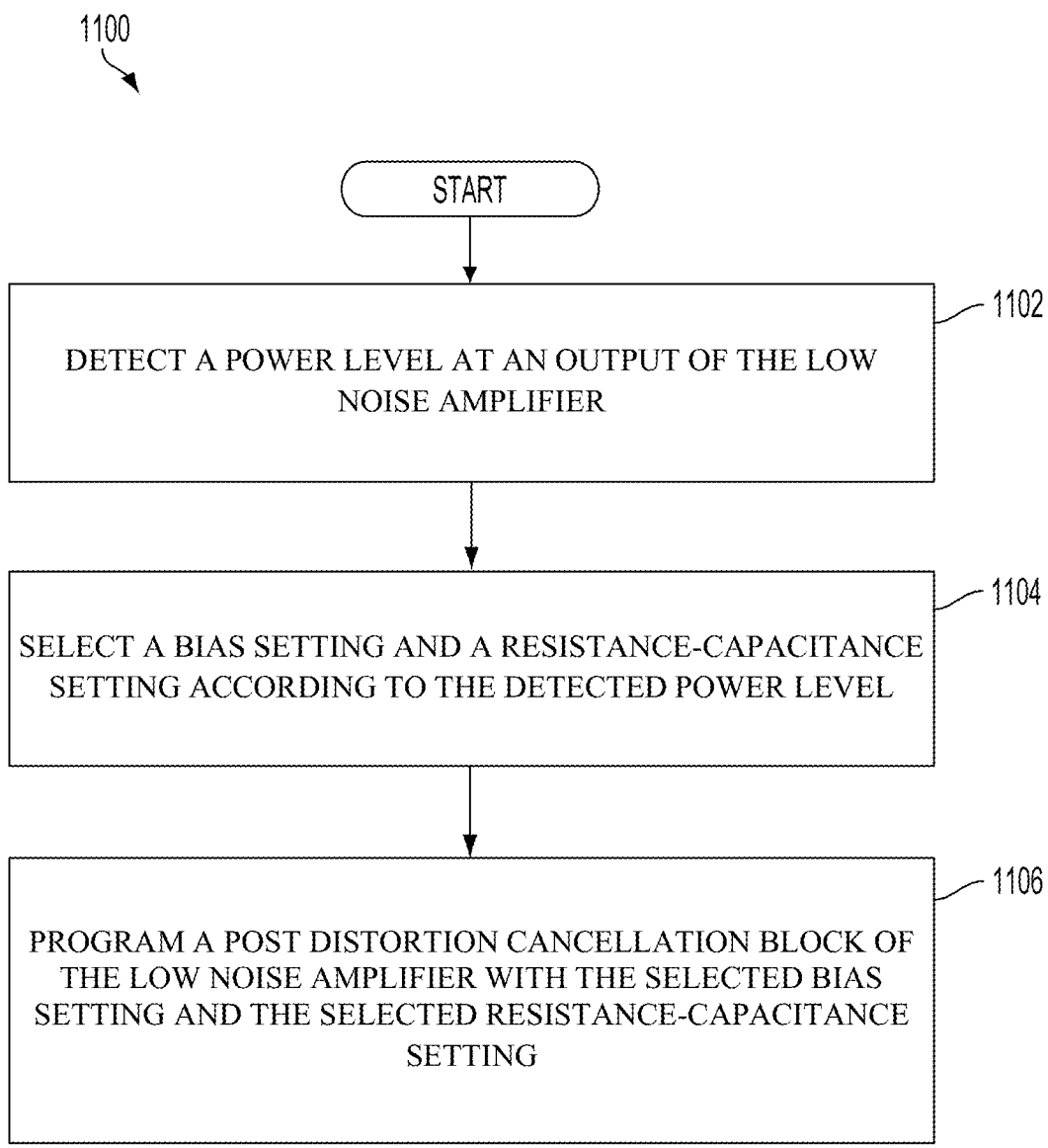
FIG. 11 depicts a simplified flowchart of a method of performing post distortion cancellation in a low noise amplifier according to aspects of the present disclosure.

FIG. 11 depicts a simplified flowchart of a method for performing post distortion cancellation in a low noise amplifier (LNA) according to one aspect of the present disclosure. The method 1100 begins at block 1102, in which a power level is detected at an output of the low noise amplifier. For example, as shown in FIG. 7, the power detector 770 detects a jammer power level at an input of the transformer 760. At block 1104, a bias setting and a resistance-capacitance setting are selected according to the detected power level. For example, a low power bias setting and a low power resistance-capacitance setting are selected when a low power jammer level is detected by the power detector 770. Alternatively, a high power bias setting and a high power resistance-capacitance setting are selected when a high power jammer level is detected by the power detector 770. At block 1106, a post distortion cancellation block of the low noise amplifier is programmed with the selected bias setting and the resistance-capacitance setting. For example, the power detector 770, the comparator 772, and the bias circuit 740 of the RF receiver 700 program settings of the post distortion cancellation block 710 to improve linearity of common source LNA topology 750 for a range of jammer power.

According to aspects of the present disclosure, linearity within the CS LNA topology is improved by including a post distortion cancellation block. The post distortion cancellation block may include a diode coupled in series with phase-shift logic. The phase-shift logic may include a resistor-capacitor circuit, in which the resistor and/or the capacitor are variable. The phase-shift logic enables sizing and biasing of the diode of the post distortion cancellation block to generate the same third order intermodulation (IM3) magnitude as a main path (high gain branch) of the CS LNA topology. The IM3 magnitude exhibits an opposite sign as a nonlinear portion of a branch current for canceling the nonlinear current. This diode configuration generates the IM3 magnitude, opposite signed current without substantially degrading the noise figure NF.

According to a further aspect of the present disclosure, a low noise amplifier is described. The low noise amplifier includes means for programming a post distortion cancellation block of the low noise amplifier with a bias setting and a resistance-capacitance setting selected according to an output power level of the low noise amplifier. The programming means may be a controller of the low noise amplifier. In another aspect, the aforementioned means may be any module, or any apparatus configured to perform the functions recited by the aforementioned means.

Figure 12:
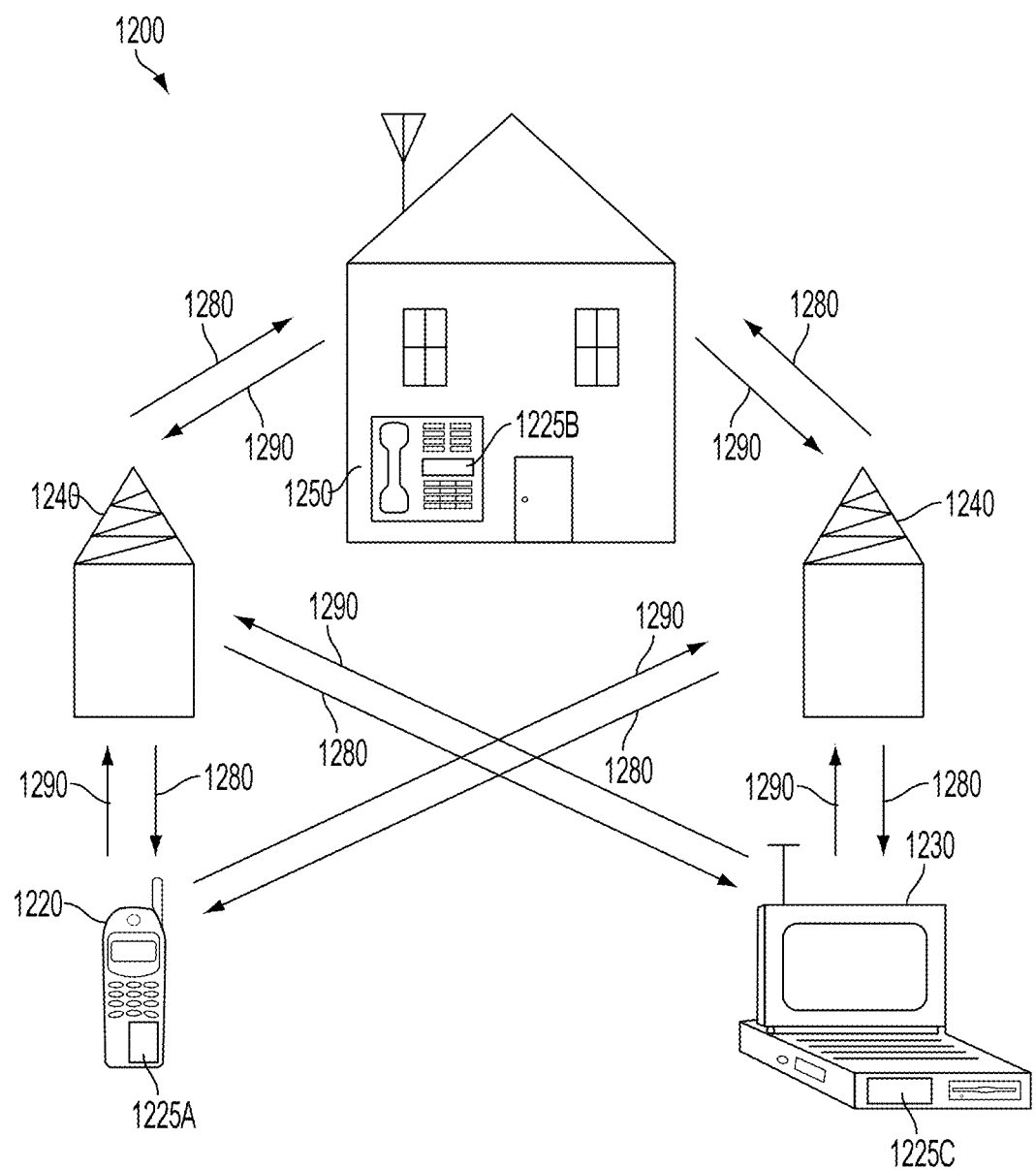
FIG. 12 is a block diagram showing an exemplary wireless communication system in which a configuration of the disclosure may be advantageously employed.

FIG. 12 is a block diagram showing an exemplary wireless communication system in which a configuration of the disclosure may be advantageously employed. For purposes of illustration, FIG. 12 shows three remote units 1220, 1230, and 1250 and two base stations 1240. It will be recognized that wireless communication systems may have many more remote units and base stations. Remote units 1220, 1230, and 1250 include IC devices 1225A, 1225C, and 1225B that include the disclosed low noise amplifier. It will be recognized that other devices may also include the disclosed low noise amplifier, such as the base stations, switching devices, and network equipment. FIG. 12 shows forward link signals 1280 from the base station 1240 to the remote units 1220, 1230, and 1250 and reverse link signals 1290 from the remote units 1220, 1230, and 1250 to base station 1240.

In FIG. 12, remote unit 1220 is shown as a mobile telephone, remote unit 1230 is shown as a portable computer, and remote unit 1250 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 12 illustrates remote units according to the aspects of the disclosure, the disclosure is not limited to these exemplary illustrated units. Aspects of the disclosure may be suitably employed in many devices, which include the low noise amplifier.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic device, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A radio frequency (RF) receiver comprising:
   a low noise amplifier comprising a first cascode transistor and a second cascode transistor;
   a post distortion cancellation block coupled to the low noise amplifier between the first cascode transistor and the second cascode transistor, the post distortion cancellation block, comprising:
      a diode, and
      phase-shift logic coupled in series with the diode, wherein a power detector is coupled to the post distortion cancellation block and an output of the low noise amplifier.

2. The RF receiver of claim 1, wherein the first cascode transistor and the second cascode transistor are part of a high gain branch and/or a low gain branch of the low noise amplifier.

3. The RF receiver of claim 1, in which the post distortion cancellation block is coupled between the first cascode transistor and the second cascode transistor.

4. The RF receiver of claim 1, in which the diode is configured as a diode coupled transistor, coupled to ground.

5. The RF receiver of claim 1, in which the phase-shift logic comprises a resistor-capacitor (RC) filter.

6. The RF receiver of claim 1, in which the post distortion cancellation block comprises:
   a first phase-shift cancellation block coupled to a high gain branch of the low noise amplifier.

7. The RF receiver of claim 1, integrated into a radio frequency (RF) front-end module, the RF front-end module incorporated into at least one of a music player, a video player, an entertainment unit, a navigation device, a communications device, a personal digital assistant (PDA), a fixed location data unit, a mobile phone, and a portable computer.

8. A method for performing post distortion cancellation in a low noise amplifier, comprising:
   detecting a power level at an output of the low noise amplifier;
   selecting a bias setting and a resistance-capacitance setting according to the power level detected at the output of the low noise amplifier; and
   programming a post distortion cancellation block of the low noise amplifier with the bias setting and the resistance-capacitance setting.

9. The method of claim 8, in which selecting the bias setting and the resistance-capacitance setting comprises selecting a high power bias setting and/or a high power resistance-capacitance setting when the power level is above a predetermined threshold.

10. The method of claim 8, further comprising programming a reference voltage to detect a high power jammer.

11. The method of claim 8, in which detecting the power level is performed prior to a transformer of the low noise amplifier.

12. The method of claim 8, in which detecting the power level is performed after a transformer of the low noise amplifier.

13. A low noise amplifier comprising:
   a post distortion cancellation block coupled to the low noise amplifier, the post distortion cancellation block, comprising:
      a diode, and
      phase-shift logic coupled in series with the diode; and
   means for programming the post distortion cancellation block with a bias setting and a resistance-capacitance setting selected according to an output power level of the low noise amplifier.

14. The low noise amplifier of claim 13, in which the post distortion cancellation block is coupled after a transformer of the low noise amplifier.

15. The low noise amplifier of claim 13, further comprising a power detector coupled to the post distortion cancellation block and an output of the low noise amplifier.

16. The low noise amplifier of claim 13, in which the diode is configured as a diode coupled transistor, coupled to ground.

17. The low noise amplifier of claim 13, in which the phase-shift logic comprises a resistor-capacitor (RC) filter.

18. The low noise amplifier of claim 13, in which the post distortion cancellation block comprises:
   a first phase-shift cancellation block coupled to a high gain branch of the low noise amplifier; and
   a second phase-shift cancellation block coupled to a low gain branch of the low noise amplifier.

19. The low noise amplifier of claim 13, integrated into a radio frequency (RF) front-end module, the RF front-end module incorporated into at least one of a music player, a video player, an entertainment unit, a navigation device, a communications device, a personal digital assistant (PDA), a fixed location data unit, a mobile phone, and a portable computer.

20. A radio frequency (RF) receiver comprising:
   a low noise amplifier comprising a first cascode transistor and a second cascode transistor; and
   a post distortion cancellation block coupled to the low noise amplifier between the first cascode transistor and the second cascode transistor, the post distortion cancellation block, comprising:

a diode, and phase-shift logic coupled in series with the diode, in which the phase-shift logic comprises a resistor-capacitor (RC) filter.

21. A radio frequency (RF) receiver comprising:
a low noise amplifier comprising a first cascode transistor and a second cascode transistor; and
a post distortion cancellation block coupled to the low noise amplifier between the first cascode transistor and the second cascode transistor, the post distortion cancellation block, comprising:
a diode,
phase-shift logic coupled in series with the diode,
a first phase-shift cancellation block coupled to a high gain branch of the low noise amplifier, and
a second phase-shift cancellation block coupled to a low gain branch of the low noise amplifier.

* * * * *